United States Patent
Lin et al.

(10) Patent No.: US 9,269,598 B2
(45) Date of Patent: Feb. 23, 2016

(54) SEMICONDUCTOR DEVICE AND METHOD OF FORMING AN IPD OVER A HIGH-RESISTIVITY ENCAPSULANT SEPARATED FROM OTHER IPDS AND BASEBAND CIRCUIT

(75) Inventors: Yaojian Lin, Singapore (SG); Jianmin Fang, Singapore (SG); Kang Chen, Singapore (SG); Haijing Cao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/569,105

(22) Filed: Aug. 7, 2012

(65) Prior Publication Data
US 2012/0292738 A1    Nov. 22, 2012

Related U.S. Application Data

(62) Division of application No. 12/205,755, filed on Sep. 5, 2008, now Pat. No. 8,263,437.

(51) Int. Cl.
| | |
|---|---|
| *H01L 27/08* | (2006.01) |
| *H01L 21/56* | (2006.01) |
| *H01L 21/683* | (2006.01) |
| *H01L 25/16* | (2006.01) |
| *H01L 25/00* | (2006.01) |

(Continued)

(52) U.S. Cl.
CPC .......... *H01L 21/568* (2013.01); *H01L 21/6835* (2013.01); *H01L 25/03* (2013.01); *H01L 25/16* (2013.01); *H01L 25/50* (2013.01); *H01L 23/5389* (2013.01); *H01L 24/16* (2013.01); *H01L 24/81* (2013.01); *H01L 2224/131* (2013.01); *H01L 2224/16225* (2013.01); *H01L 2224/16227* (2013.01); *H01L 2224/16235* (2013.01); *H01L 2224/48091* (2013.01); *H01L 2224/48247* (2013.01); *H01L 2224/73265* (2013.01);

(Continued)

(58) Field of Classification Search
CPC ... H01L 21/568; H01L 21/6835; H01L 25/03; H01L 25/16; H01L 25/50
USPC .............. 257/528, 787, E33.059, E27.009, 257/E27.114, E23.116; 438/124, 210, 238, 438/329, 381

See application file for complete search history.

(56) References Cited

U.S. PATENT DOCUMENTS

| 5,250,843 A | 10/1993 | Eichelberger |
|---|---|---|
| 5,353,498 A | 10/1994 | Fillion et al. |

(Continued)

FOREIGN PATENT DOCUMENTS

WO     2007058261 A1    5/2007

*Primary Examiner* — Colleen A Matthews
*Assistant Examiner* — Colleen E Snow
(74) *Attorney, Agent, or Firm* — Robert D. Atkins; Patent Law Group: Atkins and Associates, P.C.

(57) ABSTRACT

A semiconductor device has a first conductive layer formed over a sacrificial substrate. A first integrated passive device (IPD) is formed in a first region over the first conductive layer. A conductive pillar is formed over the first conductive layer. A high-resistivity encapsulant greater than 1.0 kohm-cm is formed over the first IPD to a top surface of the conductive pillar. A second IPD is formed over the encapsulant. The first encapsulant has a thickness of at least 50 micrometers to vertically separate the first and second IPDs. An insulating layer is formed over the second IPD. The sacrificial substrate is removed and a second semiconductor die is disposed on the first conductive layer. A first semiconductor die is formed in a second region over the substrate. A second encapsulant is formed over the second semiconductor die and a thermally conductive layer is formed over the second encapsulant.

19 Claims, 10 Drawing Sheets

(51) Int. Cl.
*H01L 25/03* (2006.01)
*H01L 23/538* (2006.01)
*H01L 23/00* (2006.01)

(52) U.S. Cl.
CPC ............... *H01L2224/81001* (2013.01); *H01L 2924/01029* (2013.01); *H01L 2924/01078* (2013.01); *H01L 2924/01079* (2013.01); *H01L 2924/01322* (2013.01); *H01L 2924/04941* (2013.01); *H01L 2924/09701* (2013.01); *H01L 2924/13091* (2013.01); *H01L 2924/14* (2013.01); *H01L 2924/1433* (2013.01); *H01L 2924/15174* (2013.01); *H01L 2924/15184* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01); *H01L 2924/30105* (2013.01)

(56) References Cited

U.S. PATENT DOCUMENTS

| | | | |
|---|---|---|---|
| 5,841,193 A | 11/1998 | Eichelberger | |
| 7,242,081 B1* | 7/2007 | Lee | H01L 25/0657 257/686 |
| 7,619,901 B2 | 11/2009 | Eichelberger et al. | |
| 7,989,895 B2* | 8/2011 | White et al. | 257/379 |
| 2004/0145039 A1* | 7/2004 | Shim et al. | 257/678 |
| 2006/0223237 A1 | 10/2006 | Combs et al. | |
| 2008/0001285 A1 | 1/2008 | Yang | |
| 2009/0170242 A1 | 7/2009 | Lin et al. | |
| 2009/0243068 A1 | 10/2009 | Kuan et al. | |
| 2009/0247670 A1 | 10/2009 | Hamada et al. | |
| 2009/0267187 A1 | 10/2009 | Hose et al. | |
| 2009/0321876 A1 | 12/2009 | Kamgaing | |
| 2010/0320599 A1 | 12/2010 | Chan et al. | |
| 2011/0018098 A1 | 1/2011 | Plum | |

* cited by examiner

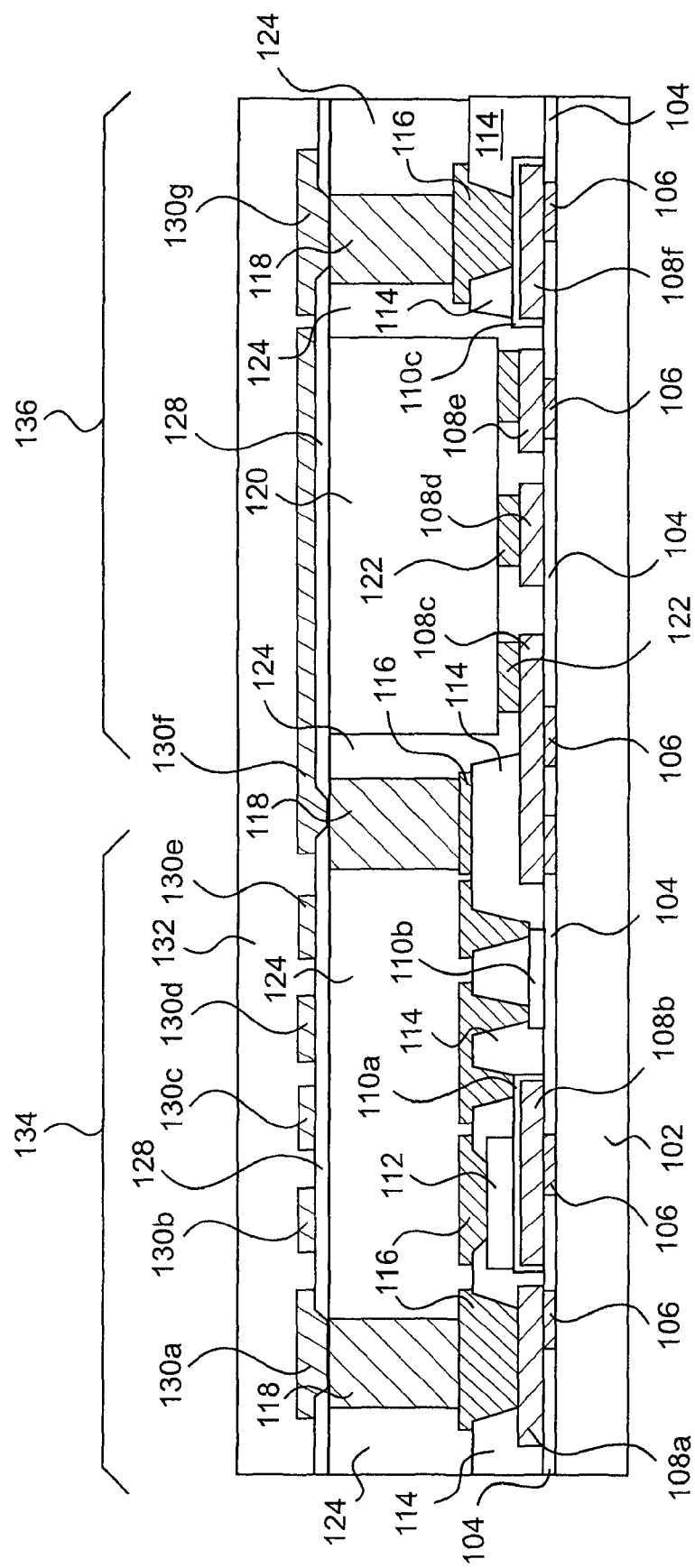

SEMICONDUCTOR DEVICE AND METHOD OF FORMING AN IPD OVER A HIGH-RESISTIVITY ENCAPSULANT SEPARATED FROM OTHER IPDS AND BASEBAND CIRCUIT

CLAIM TO DOMESTIC PRIORITY

The present application is a division of U.S. patent application Ser. No. 12/205,755, now U.S. Pat. No. 8,263,437, filed Sep. 5, 2008, which application is incorporated herein by reference.

FIELD OF THE INVENTION

The present invention relates in general to semiconductor devices and, more particularly, to a semiconductor device having an integrated passive device (IPD) formed over a high-resistivity encapsulant and separated from other IPDs and baseband circuits.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, can be produced more efficiently, and have higher performance. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

High-quality (Q) IPDs used in high frequency applications typically require a high-cost substrate having a high-resistivity, e.g., greater than 1.0 kohm-cm. The IPDs are typically formed side-by-side, or on the same wafer level, which consumes silicon area. In addition, the IPD processes needed to produce high-quality capacitors and resistors require high temperatures to deposit the requisite dielectric layers for these devices. The high-resistivity substrate and high temperature IPD processes adds cost and increases overall package size.

SUMMARY OF THE INVENTION

A need exists for a semiconductor device having high-quality IPDs without using a high-cost substrate. Accordingly, in one embodiment, the present invention is a semiconductor device comprising a first IPD formed in a first region over the semiconductor device. A conductive pillar extends above the first IPD. A semiconductor die is disposed in a second region of the semiconductor device laterally offset from the first IPD. A first encapsulant is deposited over the first IPD and semiconductor die. A second IPD is formed over the first encapsulant opposite the first IPD to reduce inter-device interference between the first IPD and second IPD.

In another embodiment, the present invention is a semiconductor device comprising a first IPD formed in a first region over the semiconductor device. A conductive pillar extends above the first IPD. A first encapsulant is deposited over the first IPD. A second IPD is formed over the first encapsulant opposite the first IPD.

In another embodiment, the present invention is a semiconductor device comprising a first IPD formed in a first region over the semiconductor device. A first encapsulant is deposited over the first IPD to a thickness of at least 50 micrometers. A second IPD is formed over the first encapsulant opposite the first IPD to reduce inter-device interference between the first IPD and second IPD.

In another embodiment, the present invention is a semiconductor device comprising a first IPD formed in a first region over the semiconductor device. An encapsulant having a resistivity greater than 1.0 kohm-cm is deposited over the first IPD. A second IPD is formed over the encapsulant opposite the first IPD to reduce inter-device interference between the first IPD and second IPD.

BRIEF DESCRIPTION OF THE DRAWINGS

FIGS. 3a-3e illustrate a semiconductor device having an IPD formed over a high-resistivity encapsulant and separated from other IPDs and baseband circuits;

DETAILED DESCRIPTION OF THE DRAWINGS

Figure 1:
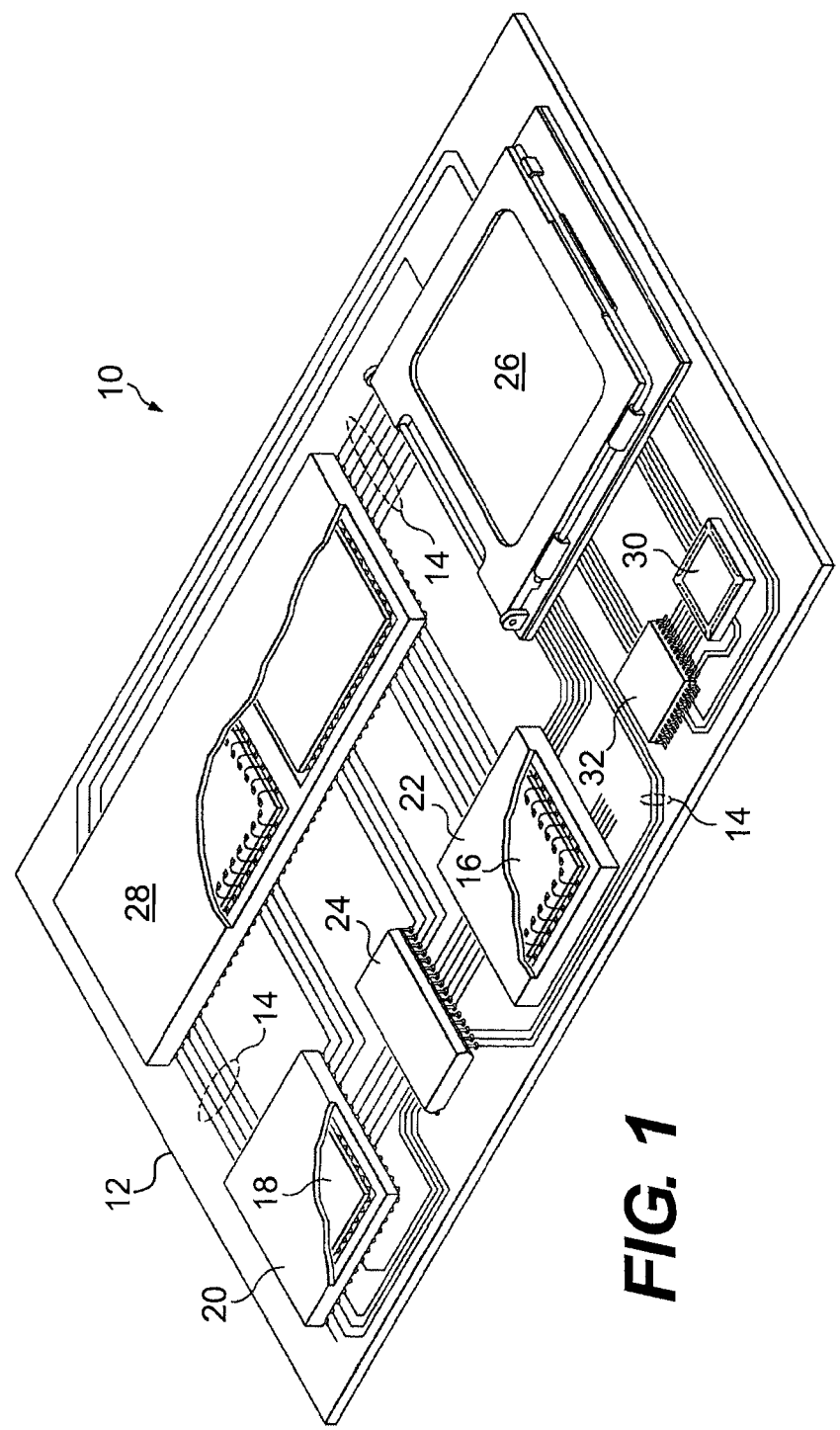
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical remove any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
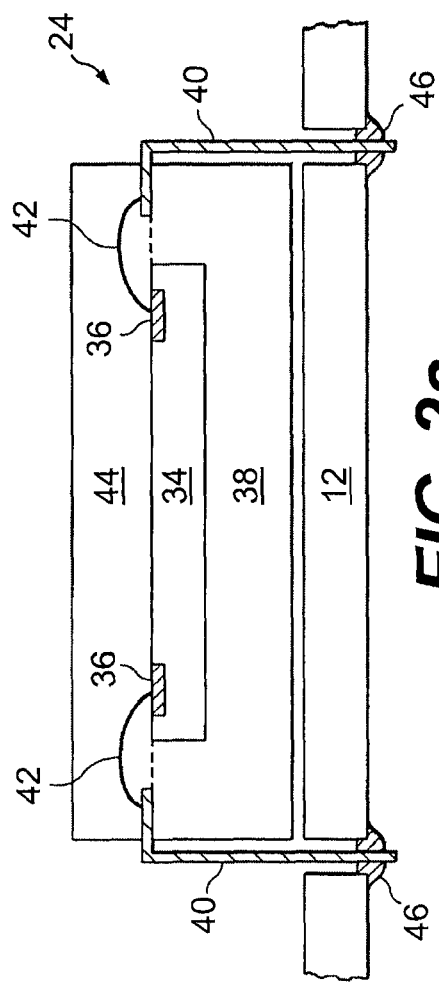
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
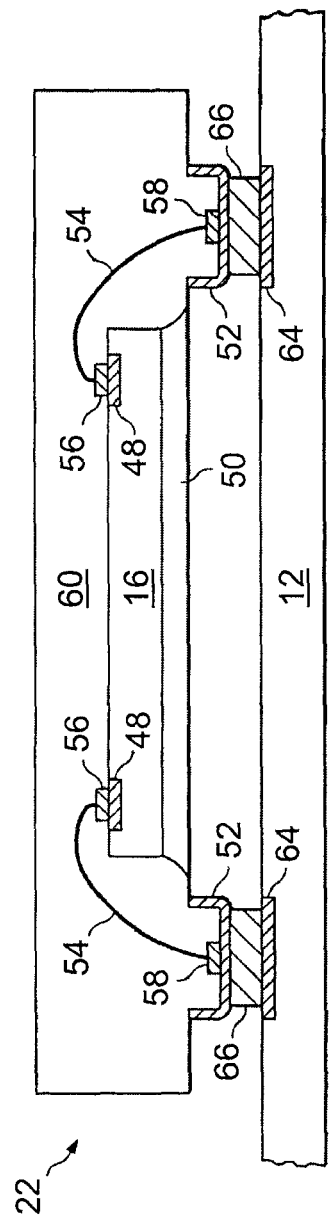

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Mold compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
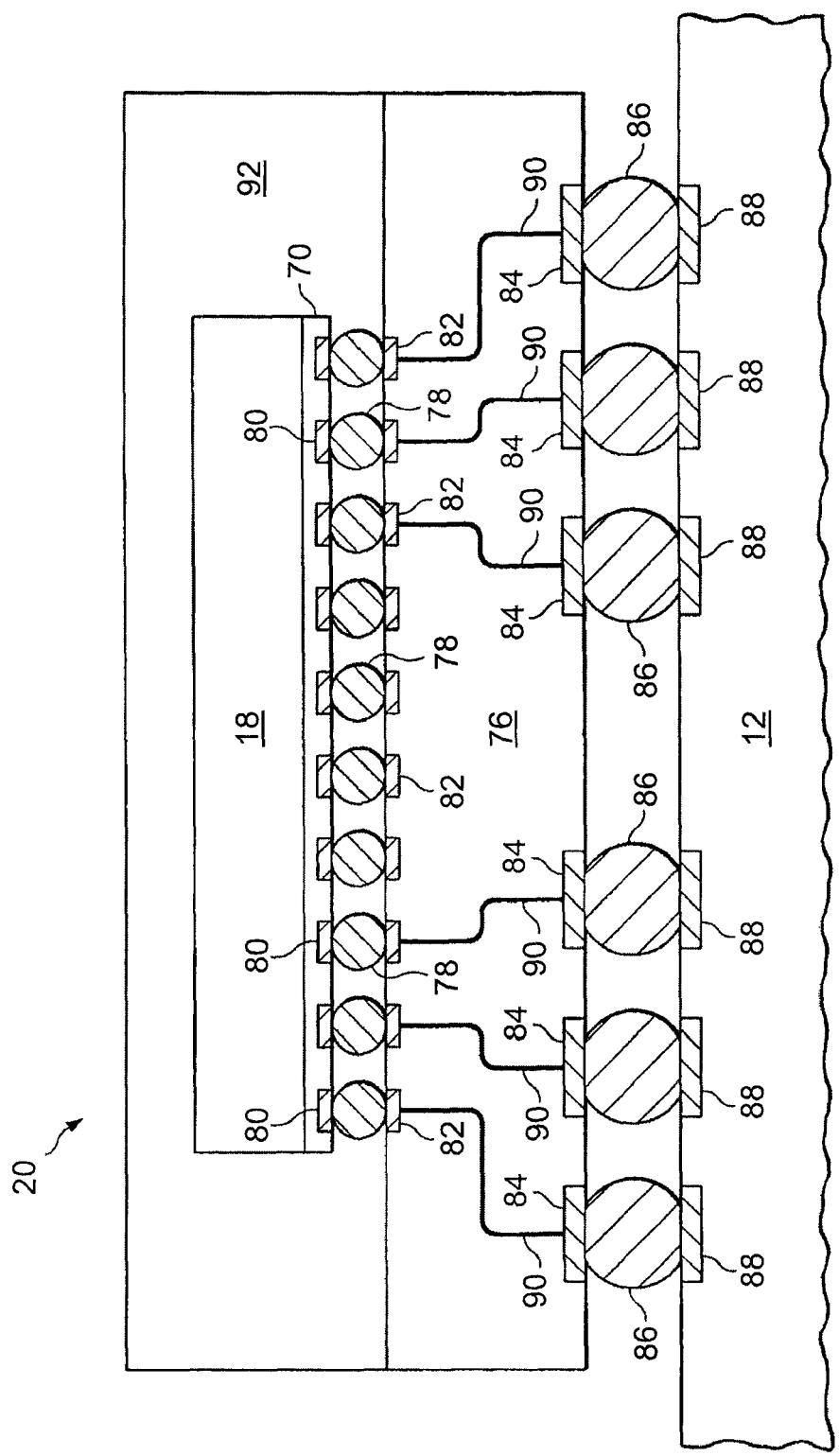

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Mold compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
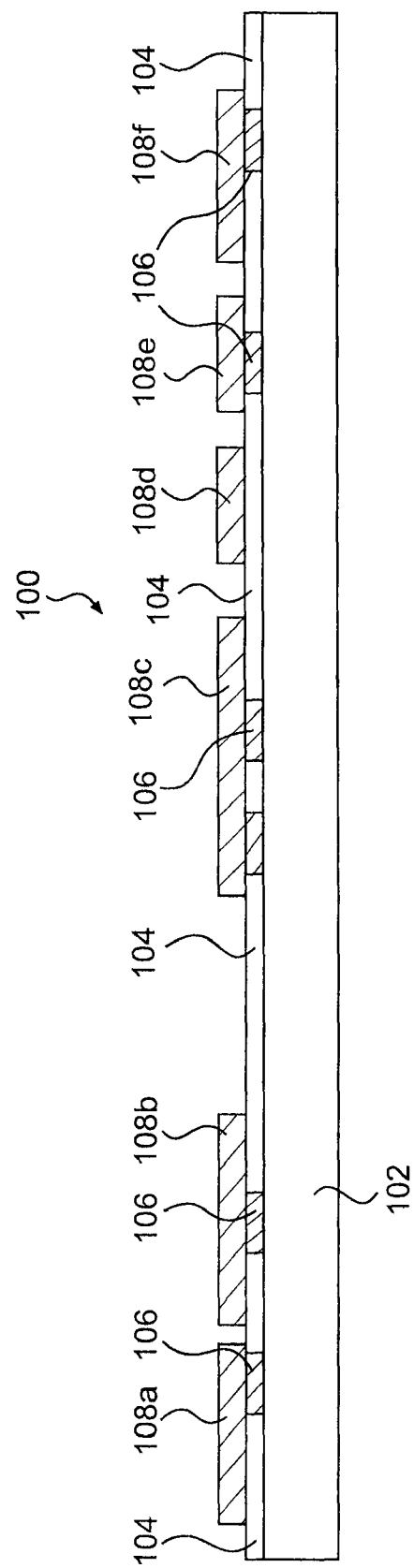

FIGS. 3a-3e illustrate a process of forming an integrated passive device (IPD) over a high-resistivity molding compound on wafer 100. In FIG. 3a, an insulating layer 104 is formed on substrate 102. Substrate 102 is a dummy or sacrificial base material such as silicon (Si), ceramic, glass, or other suitable low-cost, rigid material. The insulating layer 104 can be silicon dioxide (SiO2), silicon nitride (Si3N4), silicon oxynitride (SiON), tantalum pentoxide (Ta2O5), zircon (ZrO2), aluminum oxide (Al2O3), or other material having suitable insulating properties. The insulating layer 104 is patterned or blanket deposited using PVD, CVD, printing, and sintering or thermal oxidation and result in a thickness ranging from 100-20000 Å. The insulating layer 104 can single or multiple layers. The insulating layer 104 is optional, provides stress relief and operates as an etch stop.

In one embodiment, a portion of insulating layer 104 is removed to form vias 106. An electrically conductive layer 108 is formed on insulating layer 104 using a patterning and deposition process to form individual portions or sections 108a-108f. The individual portions of conductive layer 108 can be electrically common or electrically isolated depending on the connectivity of the individual semiconductor die formed on wafer 100. Conductive layer 108 fills vias 106. In one embodiment, conductive layer 108 is stacked Ti/NiV/Cu or Al/NiV/Cu with Ti or AL as an adhesive layer, nickel vanadium (NiV) as a barrier layer, and Cu as a wetting layer. Alternately, conductive layer 108 can be Al, Cu, Sn, Ni, Au, Ag, or other suitable material with optional adhesion and barrier layers containing titanium (Ti), titanium tungsten (TiW), titanium nitride (TiN), tantalum (Ta), or tantalum nitride (TaN). The deposition of conductive layer 108 uses PVD, CVD, electrolytic plating, or electroless plating process.

Figure 3B:
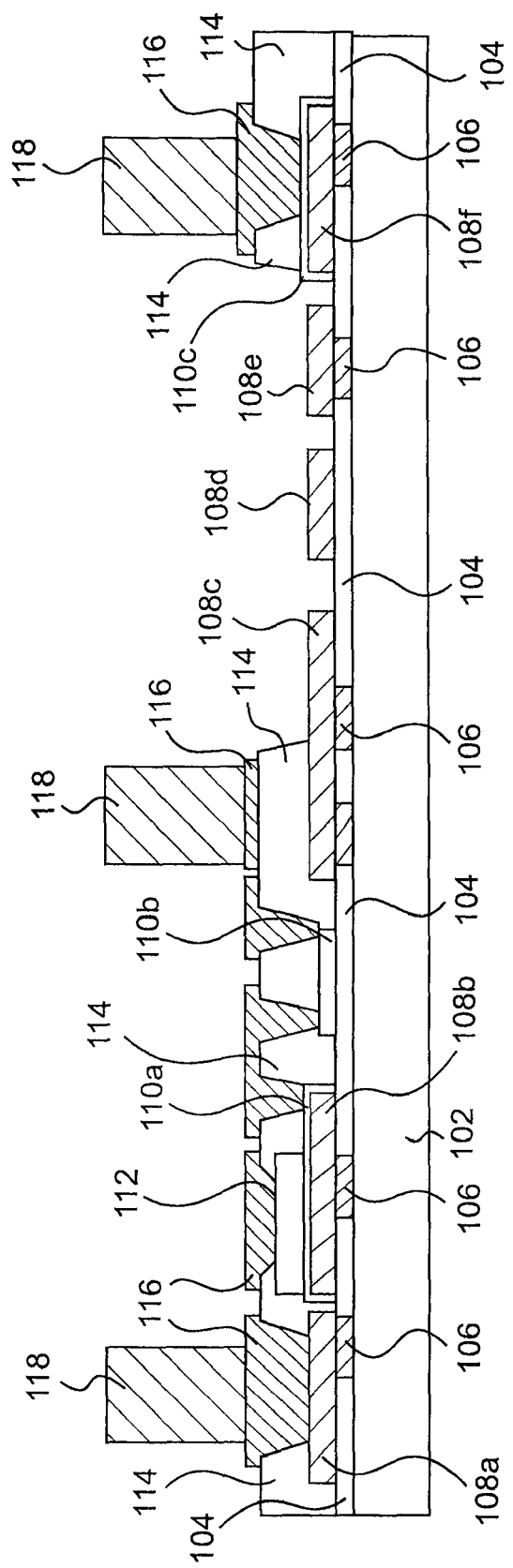

In FIG. 3b, a resistive layer 110 is patterned and deposited on conductive layers 108 and insulating layer 104 using PVD or CVD. Resistive layer 110 has individual portions or sections 110a-110c. Resistive layer 110a is deposited over conductive layer 108b. Resistive layer 110b is deposited over insulating layer 104 between conductive layers 110b-110c. Resistive layer 110c is formed over conductive layer 108f. Resistive layer 110 is tantalum silicide (TaxSiy) or other metal silicides, TaN, nickel chromium (NiCr), TiN, or doped poly-silicon having a resistivity between 5 and 100 ohm/sq.

An insulating layer 112 is formed over resistive layer 110a using a patterning and deposition process. The insulating layer 112 is Si3N4, SiO2, SiON, Ta2O5, ZnO, ZrO2, Al2O3, or other suitable dielectric material. The deposition of insulating layer 112 may involve PVD or CVD. Resistive layer 110 and insulating layer 112 are formed with the same mask and etched at the same time. Alternatively, resistive layer 110 and insulating layer 112 can be patterned and etched with a different mask.

A passivation layer 114 is formed over insulating layer 104, conductive layer 108, resistive layer 110, and insulating layer 112. Passivation layer 114 can be polyimide, BCB, SiO2, Si3N4, SiON, Ta2O5, Al2O3, or other suitable material having insulating properties. The deposition of passivation layer 114 may involve spin coating, PVD, CVD, printing and sintering, or thermal oxidation. A portion of passivation layer 114 is removed to expose conductive layer 108a, insulating layer 112, resistive layer 110a-110c, insulating layer 104, and conductive layer 108c-108e, as shown in FIG. 3b.

An electrically conductive layer 116 is formed over conductive layer 108a, insulating layer 112, resistive layer 110a-c, and passivation layer 114. Conductive layer 116 is Al, Cu, Sn, Ni, Au, Ag, or other suitable material. The deposition of conductive layer 116 uses PVD, CVD, electrolytic plating, or electroless plating process.

Conductive pillars or posts 118 are formed over conductive layer 116. Conductive pillars 118 can be Cu, Al, W, Au, solder, or other suitable material. To form conductive pillars, a thick layer of photoresist, e.g., 100-200 μm, is deposited over conductive layer 116. The photoresist can be a liquid or a dry film. Two layers of photoresist may be applied to achieve the desired thickness. The photoresist is patterned and metal is deposited in the patterned areas of the photoresist using PVD, CVD, electrolytic plating, or electroless plating process. The photoresist is stripped away leaving behind individual conductive pillars 118.

In another embodiment, the conductive pillars 118 can be replaced with solder balls or Au stud bumps. An adhesion layer may be deposited and patterned to improve adhesion of conductive layer 116 on passivation 114. The adhesion layer is removed in areas exposed by conductive layer 116 by an etching process. An additional passivation layer may be formed over passivation layer 114 and conductive layer 116 to provide structural support and electrical isolation. The additional passivation layer is patterned to expose portions of conductive layer 116. Solder balls are formed over the conductive layer 116 in the patterned areas of the additional passivation layer.

The structures described in FIGS. 3a-3b, e.g., the combination of conductive layer 108, resistive layer 110, insulating layer 112, and conductive layer 116, constitute one or more passive circuit elements or IPDs. For example, conductive layer 108b, resistive layer 110a, insulating layer 112, and conductive layer 116 is a metal-insulator-metal (MIM) capacitor. Resistive layer 110b is a resistor element in the passive circuit. Other active and passive circuit elements can be formed on wafer 100 as part of the electrically functional semiconductor device.

Figure 3C:
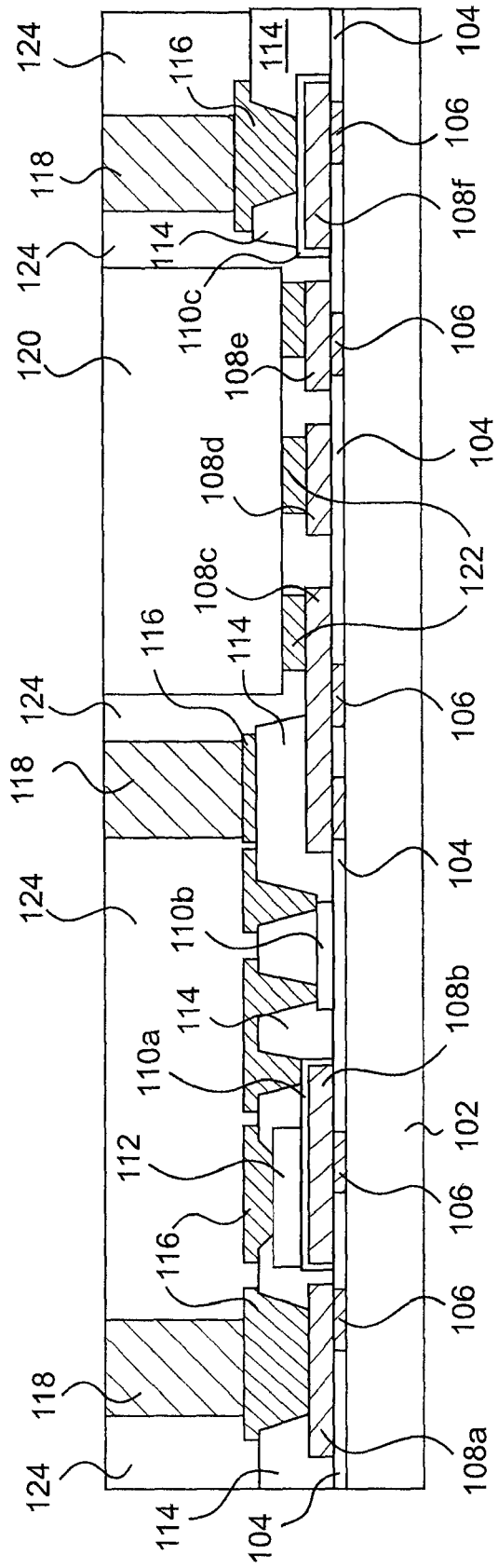

FIG. 3c shows a semiconductor device 120 mounted to conductive layer 108c-108e using electrical connections 122, e.g., solder bumps, metal bonding, or conductive paste. For example, semiconductor die 120 can be a baseband digital circuit, such as digital signal processor (DSP) or memory. Note that a top surface of conductive pillar 118 and semiconductor device 120 have about the same height. Alternatively, if conductive pillar 118 and semiconductor device 120 have different heights, then semiconductor device 120 is typically made higher. In other embodiments, conductive pillars 118 are higher than semiconductor device 120.

An encapsulant or molding compound 124 is deposited over the IPD structure, between conductive pillars 118, and around semiconductor device 120 using a printing, compressive molding, transfer molding, liquid encapsulant molding, or other suitable applicator. Encapsulant 124 extends to a top surface of conductive pillars 118. Encapsulant 124 can be epoxy resin, epoxy acrylate, polymer, or polymer composite material. Encapsulant 124 is non-conductive and environmentally protects the semiconductor device from external elements and contaminants. Encapsulant 124 has a coefficient of thermal expansion (CTE) that is adjusted to match that of the base semiconductor material, e.g., Si, with glass transition temperature (Tg) greater than 100° C. The CTE of encapsulant 124 can be adjusted using a filler such as a powder, fiber, or cloth additive. A suitable encapsulant material is generally characterized by low-shrinkage, high-resistivity of greater than 1.0 kohm-cm, low-dielectric constant of less than 4, and low-loss tangent of less than 0.05 in 500 MHz to 30 GHz range. Encapsulant 124 undergoes grinding or etch-back to expose conductive pillars 118.

In FIG. 3d, an insulating layer 128 is formed over conductive pillars 118, semiconductor device 120, and encapsulant 124 using spin coating or laminate with an adhesive. A portion of insulating layer 128 is removed using an etching process to expose conductive pillars 118. The insulating layer 128 is optional.

An electrically conductive layer 130 is formed over encapsulant 124, insulating layer 128, and conductive pillars 118 using a patterning and deposition process to form individual portions or sections 130a-130g. The individual portions of conductive layer 130 can be electrically common or electrically isolated depending on the connectivity of the individual semiconductor die formed on wafer 100. Conductive layer 130 can be Al, Cu, Sn, Ni, Au, Ag, or other suitable material. The deposition of conductive layer 130 uses PVD, CVD, electrolytic plating, or electroless plating process.

An insulating layer 132 is formed over insulating layer 128 and conductive layer 130 using a patterning and deposition process. The insulating layer 132 can be epoxy matrix polymer, Si3N4, SiO2, SiON, Ta2O5, ZnO, ZrO2, Al2O3, or other suitable insulating material. The deposition of insulating layer 132 may involve spin coating, printing, molding, or lamination with polymer matrix composite.

The conductive layer 130b-130e constitute an IPD, in this case an inductor. The conductive layer 130b-130e is typically wound or coiled in plan-view to produce or exhibit the desired inductive properties. Conductive layer 130b-130e is formed over encapsulant 124 and insulating layer 128. The inductor 130b-130e is separated from the other IPDs, i.e., MIM capacitor and resistive layer 110b, by the thickness of encapsulant 124 and insulating layer 128, e.g., about 50 micrometers (μm). By forming the inductor over encapsulant 124, which has high resistivity, low loss tangent, low dielectric constant, and matching CTE, high quality IPDs can be realized, without using a high-resistivity substrate. In addition, vertically separating the inductor from the MIM capacitor and resistor with high-resistivity encapsulant 124, i.e., stacking the IPDs rather than spacing them laterally across the die, saves silicon area and provides a smaller package. Other types of IPDs, such as capacitors and resistors, can be formed over the high-resistivity encapsulant 124 and insulating layer 128.

Conductive layer 130a, 130f, and 130g electrically connect to conductive pillars 118. The inductor formed by conductive layer 130b-130e resides over encapsulant 124. In the present embodiment, there is no conductive pillar under the inductor structure 130b-130e.

The IPDs contained within wafer 100 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. However, high frequency electrical devices generate or are susceptible to undesired EMI, RFI, or other inter-device interference, such as capacitive, inductive, or conductive coupling, also known as cross-talk.

Note in FIG. 3d that high frequency IPDs are contained within region 134 of wafer 100. Baseband components are contained within region 136 of wafer 100. The high frequency IPDs are thus separated from the baseband components to reduce electromagnetic interference (EMI) and radio frequency interference (RFI), and other inter-device interference between the devices, such as capacitive, inductive, or conductive coupling, also known as cross-talk. High frequency components in region 134 and baseband components in region 136 constitute a system-in-package (SiP) arrangement.

Figure 3E:
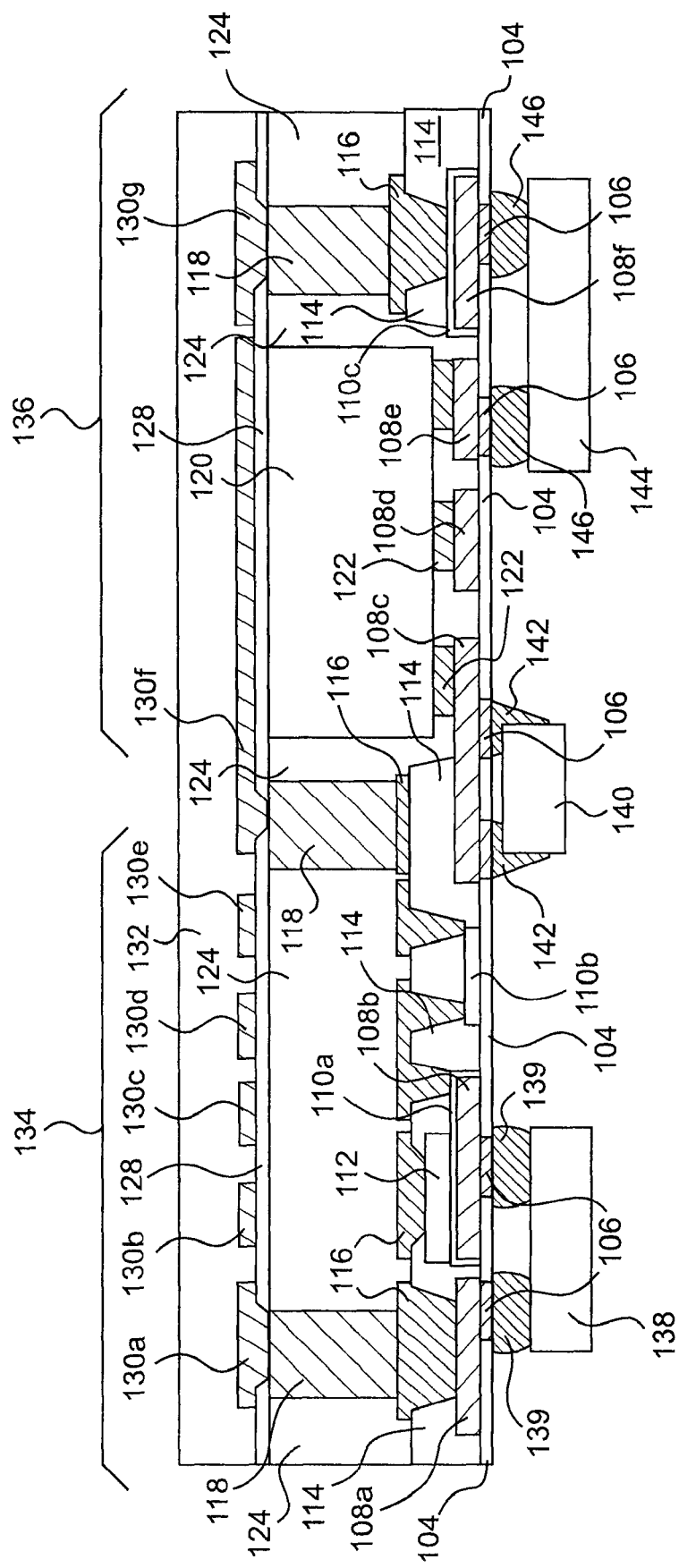

In FIG. 3e, sacrificial substrate 102 is removed by mechanical back grinding, CMP, wet etching, or dry etching. Semiconductor die 138 is surface-mounted to conductive vias 106 with solder bumps 139. In one embodiment, semiconductor die 138 contains IPDs such as inductors, resistor, or capacitors. Likewise, semiconductor component 140 is surface-mounted to conductive vias 106 with conductive paste 142, and semiconductor die 144 is surface-mounted to conductive vias 106 with solder bumps 146. Semiconductor components 140 and 144 may contain digital circuit components, such as baseband signal processing circuits or memory devices.

Figure 4:
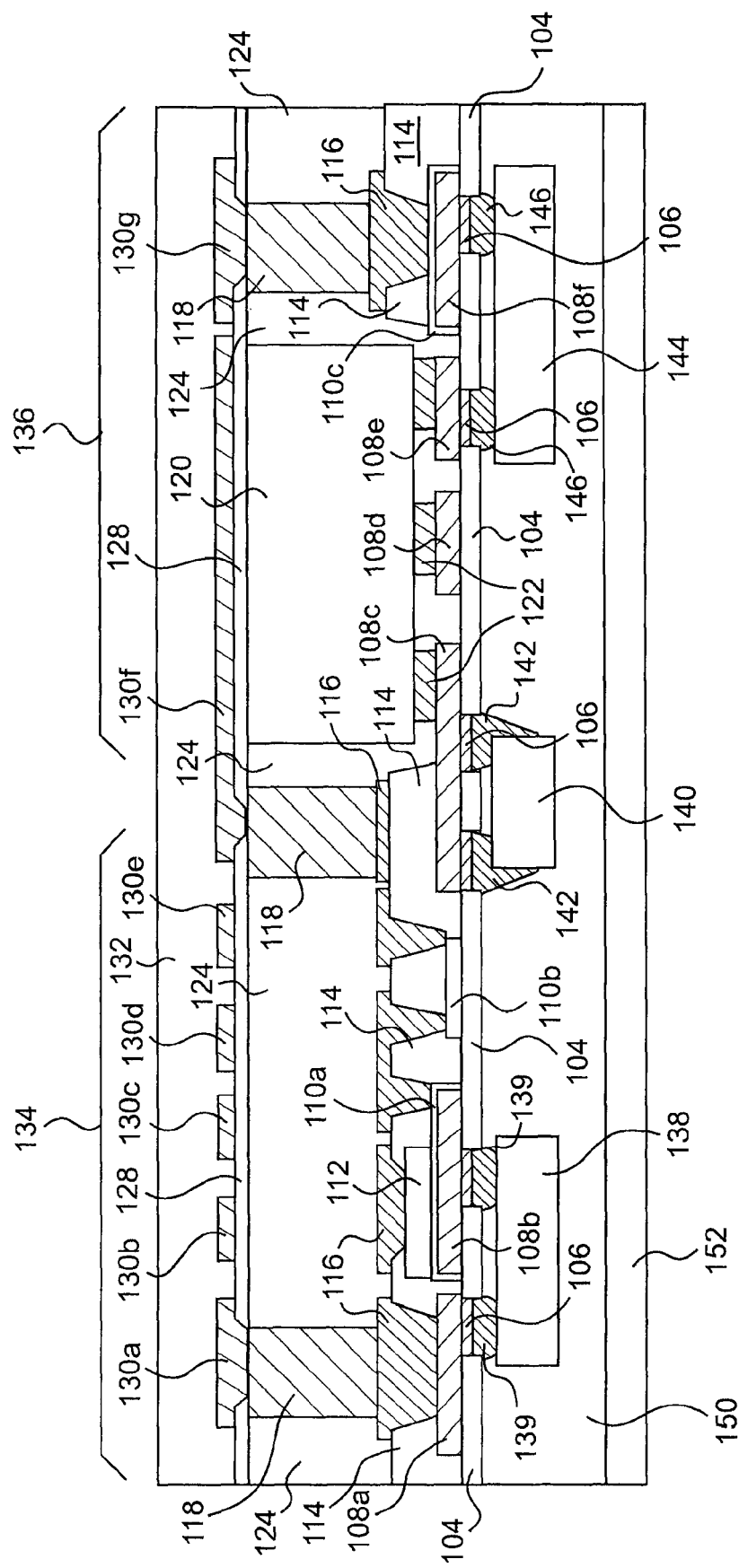
FIG. 4 illustrates the semiconductor device with backside encapsulant and heat sink.

FIG. 4 shows the device from FIG. 3e with encapsulant or molding compound 150 formed on a backside of the wafer over semiconductor devices 138, 140, and 144. The IPDs and semiconductor die generate heat during normal operation. A thermally conductive layer or heat sink 152 is attached to molding compound 150 with an adhesive for thermal dissipation and high reliability. Heat sink 152 conducts heat away from the semiconductor device.

Figure 5:
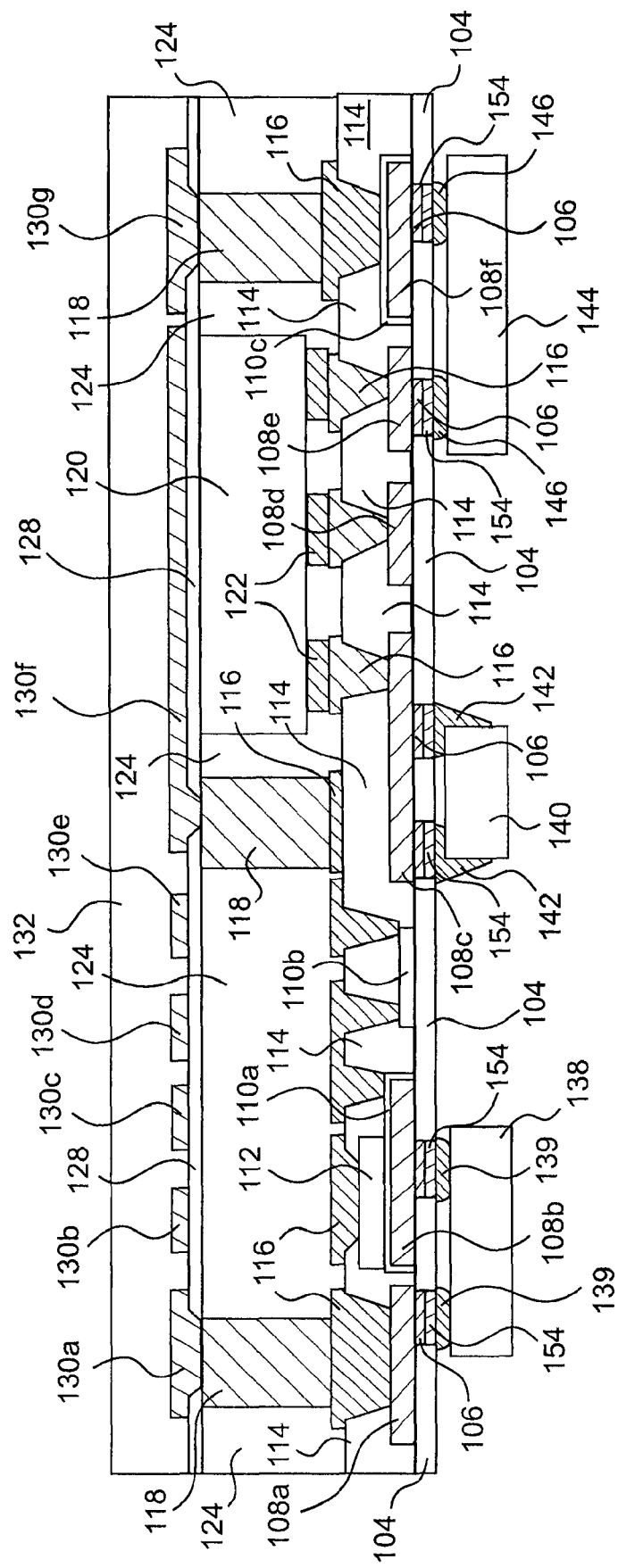
FIG. 5 illustrates the semiconductor device with additional passivation layer and conductive layer formed under the baseband semiconductor die.

FIG. 5 shows additional passivation layer 114 and conductive layer 116 formed over conductive layer 108c-108e. Conductive layer 116 operates as under bump metallization (UBM) for electrical connections 122 to semiconductor device 120. In addition, UBM layer 154 is formed on conductive vias 106 for solder bumps 139, 142, and 146. UBM can be Ni/Au or Ti/NiV/Cu.

In summary, an upper IPD (e.g. an inductor) is formed over the high-resistivity molding compound, which eliminates the need for a high-cost substrate. The upper IPD is vertically separated from the lower IPDs (e.g. MIM capacitor and resistor) by the high-resistivity encapsulant, i.e. IPDs are stacked and separated by high-resistivity encapsulant, resulting in a small RF SiP with high quality IPDs. The high frequency IPDs are further separated from the baseband components to reduce EMI, RFI, and other inter-device interference.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first integrated passive device (IPD) formed in a first region of the semiconductor device;
   a conductive pillar formed over a surface of the first IPD;
   a semiconductor die disposed in a second region of the semiconductor device laterally offset from the first IPD;
   a first encapsulant deposited over the first IPD and semiconductor die;
   an insulating layer formed over the first encapsulant; and
   a second IPD formed over the first encapsulant and insulating layer opposite the first IPD to reduce inter-device interference between the first IPD and second IPD.

2. The semiconductor device of claim 1, wherein the first IPD and second IPD include a resistor, capacitor, or inductor.

3. The semiconductor device of claim 1, further including a semiconductor component disposed over a surface of the semiconductor device opposite the second IPD.

4. The semiconductor device of claim 3, further including a second encapsulant formed over the semiconductor component.

5. The semiconductor device of claim 1, wherein the first encapsulant includes a resistivity greater than 1.0 kohm-cm.

6. The semiconductor device of claim 1, wherein the first IPD is separated from the second IPD by a thickness of at least 50 micrometers.

7. A semiconductor device, comprising:
   a first integrated passive device (IPD) formed in a first region of the semiconductor device;
   a conductive pillar formed in a peripheral region of the first IPD and extending above the first IPD;
   a first semiconductor die disposed in a second region of the semiconductor device laterally offset from the first IPD;
   an encapsulant deposited over the first IPD, first semiconductor die, and conductive pillar;
   an insulating layer formed over the encapsulant; and
   a second IPD formed over the encapsulant and insulating layer opposite the first IPD to reduce inter-device interference between the first IPD and second IPD.

8. The semiconductor device of claim 7, further including a second semiconductor die disposed over a surface of the semiconductor device opposite the second IPD.

9. The semiconductor device of claim 7, wherein the first IPD and second IPD include a resistor, capacitor, or inductor.

10. The semiconductor device of claim 7, further including a heat sink disposed over a surface of the semiconductor device.

11. The semiconductor device of claim 7, wherein the first IPD or second IPD includes a high frequency IPD and the first semiconductor die includes a baseband component.

12. The semiconductor device of claim 7, wherein the encapsulant includes a resistivity greater than 1.0 kohm-cm.

13. The semiconductor device of claim 7, wherein the encapsulant includes a thickness of at least 50 micrometers.

14. A semiconductor device, comprising:
   a first integrated passive device (IPD) formed in a first region of the semiconductor device;
   a conductive pillar formed over a surface of the first IPD;
   a semiconductor die disposed in a second region of the semiconductor device laterally offset from the first IPD;
   a single encapsulant layer deposited over the first IPD and around the semiconductor die;
   an insulating layer formed over the single encapsulant layer; and
   a second IPD formed over the single encapsulant layer and insulating layer opposite the first IPD to reduce inter-device interference between the first IPD and second IPD.

15. The semiconductor device of claim 14, wherein the first IPD is separated from the second IPD by at least 50 micrometers.

16. The semiconductor device of claim 14, wherein the first IPD and second IPD include a resistor, capacitor, or inductor.

17. The semiconductor device of claim 14, further including a semiconductor component disposed over a surface of the semiconductor device.

18. The semiconductor device of claim 14, wherein the first IPD or second IPD includes a high frequency IPD and the semiconductor die includes a baseband component.

19. The semiconductor device of claim 14, wherein the single encapsulant layer includes a resistivity greater than 1.0 kohm-cm.

* * * * *